(12) United States Patent
Choi et al.

(10) Patent No.: US 11,849,600 B2
(45) Date of Patent: *Dec. 19, 2023

(54) PROTECTIVE FILM, DISPLAY MODULE, DISPLAY DEVICE, METHOD OF MANUFACTURING DISPLAY MODULE, AND METHOD OF MANUFACTURING DISPLAY DEVICE

(71) Applicant: Samsung Display Co., Ltd., Yongin-Si (KR)

(72) Inventors: Dongwan Choi, Seoul (KR); Doyoub Kim, Suwon-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/726,238

(22) Filed: Apr. 21, 2022

(65) Prior Publication Data

US 2022/0246886 A1  Aug. 4, 2022

Related U.S. Application Data

(63) Continuation of application No. 17/007,111, filed on Aug. 31, 2020, now Pat. No. 11,329,256, which is a (Continued)

(30) Foreign Application Priority Data

Sep. 8, 2017 (KR) .................... 10-2017-0115417

(51) Int. Cl.
*H10K 50/844* (2023.01)
*G02F 1/1333* (2006.01)
(Continued)

(52) U.S. Cl.
CPC ..... *H10K 50/844* (2023.02); *G02F 1/133305* (2013.01); *H10K 59/12* (2023.02);
(Continued)

(58) Field of Classification Search
None
See application file for complete search history.

(56) References Cited

U.S. PATENT DOCUMENTS 8,692,461 B2    4/2014   Ha et al.
8,780,579 B2 *  7/2014   Kwon .................. G06F 1/1637
                                                         361/784
(Continued)

FOREIGN PATENT DOCUMENTS

CN   101794848 A   8/2010
CN   102439105 A   5/2012
(Continued)

*Primary Examiner* — Hung K Vu
(74) *Attorney, Agent, or Firm* — Innovation Counsel LLP

(57) ABSTRACT

A display module includes a display panel for displaying an image, and a protective film adhered to a back surface of the display panel. The protective film includes a compensation layer being in contact with the back surface of the display panel, a first release layer disposed under the compensation layer, a cushion layer disposed under the first release layer, and a second release layer disposed under the cushion layer. An adhesive strength of the first release layer is less than an adhesive strength of the second release layer.

19 Claims, 14 Drawing Sheets

Related U.S. Application Data continuation of application No. 15/937,124, filed on Mar. 27, 2018, now Pat. No. 10,777,769.

(51) Int. Cl.
  *H10K 59/12* (2023.01)
  *H10K 71/00* (2023.01)
  *H10K 71/80* (2023.01)
  *H10K 77/10* (2023.01)
  *H10K 102/00* (2023.01)

(52) U.S. Cl.
  CPC ............ *H10K 71/00* (2023.02); *H10K 71/80* (2023.02); *H10K 77/111* (2023.02); *G02F 2201/50* (2013.01); *G02F 2202/22* (2013.01); *G02F 2202/28* (2013.01); *H10K 59/1201* (2023.02); *H10K 2102/311* (2023.02)

(56) References Cited

U.S. PATENT DOCUMENTS

| | | |
|---|---|---|
| 9,825,227 B2 | 11/2017 | Kim |
| 10,022,946 B2 | 7/2018 | Kim et al. |
| 10,048,786 B2 | 8/2018 | Ahn et al. |
| 10,411,224 B2 | 9/2019 | Heo et al. |
| 10,777,769 B2 * | 9/2020 | Choi ................ G02F 1/133305 |
| 2009/0261718 A1 | 10/2009 | Ha et al. |
| 2010/0186883 A1 | 7/2010 | Tomoda |
| 2012/0064338 A1 | 3/2012 | Niimi et al. |
| 2012/0170244 A1 | 7/2012 | Kwon et al. |
| 2016/0270269 A1 | 9/2016 | Bae et al. |
| 2017/0210915 A1 | 7/2017 | Lee et al. |
| 2018/0163318 A1 | 6/2018 | Kamo et al. |

FOREIGN PATENT DOCUMENTS

| | | |
|---|---|---|
| CN | 103378314 A | 10/2013 |
| CN | 105976701 A | 9/2016 |
| KR | 10-2008-0004019 A | 1/2008 |
| KR | 10-2008-0070448 A | 7/2008 |
| KR | 10-2009-0110052 A | 10/2009 |
| KR | 10-0932985 B1 | 12/2009 |
| KR | 10-2013-0051367 A | 5/2013 |
| KR | 10-2014-0076151 A | 6/2014 |
| KR | 10-2014-0137249 A | 12/2014 |
| KR | 10-2015-0129174 A | 11/2015 |
| KR | 10-1596725 B1 | 2/2016 |

* cited by examiner

PROTECTIVE FILM, DISPLAY MODULE, DISPLAY DEVICE, METHOD OF MANUFACTURING DISPLAY MODULE, AND METHOD OF MANUFACTURING DISPLAY DEVICE

CROSS-REFERENCE TO RELATED APPLICATION

This application is a continuation application of U.S. patent application Ser. No. 17/007,111 filed on Aug. 31, 2020, which is a continuation of U.S. patent application Ser. No. 15/937,124 filed on Mar. 27, 2018, now U.S. Pat. No. 10,777,769, which claims priority under 35 USC § 119 to Korean Patent Application No. 10-2017-0115417, filed on Sep. 8, 2017, in the Korean Intellectual Property Office, the disclosures of which are incorporated herein in their entirety by reference.

BACKGROUND

1. Field

Embodiments of the invention relate to a protective film, a display module, a display device, a method of manufacturing a display module, and a method of manufacturing a display device.

2. Description of the Related Art

Display devices are becoming thinner Thus, if only a compensation layer is adhered to a display panel in a display module, various types of defects may occur by a thin thickness of the compensation layer before assembling a set. For example, an appearance of the display module may be damaged by a stab during movement. In particular, when the display panel has a flexible film as a base film, malfunction of the display panel may occur due to the appearance damage.

SUMMARY

Embodiments of the invention may provide a protective film, a display module, a display device, a method of manufacturing a display module, and a method of manufacturing a display device.

In an aspect of the invention, a display module may include a display panel for displaying an image, and a protective film adhered to a back surface of the display panel. The protective film may include a compensation layer being in contact with the back surface of the display panel, a first release layer disposed under the compensation layer, a cushion layer disposed under the first release layer, and a second release layer disposed under the cushion layer. An adhesive strength of the first release layer may be less than an adhesive strength of the second release layer.

A thickness of the cushion layer may be greater than a thickness of the compensation layer.

The cushion layer may include polymer resin foam.

The first release layer may include a grip portion protruding from an edge of the first release layer in a plan view.

The first release layer may include a first sub-release layer having a first adhesive strength, and a second sub-release layer having a second adhesive strength less than the first adhesive strength. The first adhesive strength and the second adhesive strength may be less than the adhesive strength of the second release layer.

A groove or a hole may be provided in an area of the cushion layer, which overlaps with a boundary between the first sub-release layer and the second sub-release layer when viewed in a plan view.

The compensation layer may include a first antistatic layer, a colored layer disposed under the first antistatic layer; and a second antistatic layer disposed under the colored layer.

The protective film may further include an adhesive layer disposed between the first release layer and the cushion layer to adhere the first release layer to the cushion layer.

In an aspect of the invention, a protective film may include a protective paper, a compensation layer disposed under the protective paper, a first release layer disposed under the compensation layer, a cushion layer disposed under the first release layer, and a second release layer disposed under the cushion layer. An adhesive strength of the first release layer may be less than an adhesive strength of the second release layer.

A thickness of the cushion layer may be greater than a thickness of the compensation layer, and the cushion layer may include polymer resin foam.

The first release layer may include a grip portion protruding from an edge of the first release layer in a plan view.

The first release layer may include a first sub-release layer having a first adhesive strength, and a second sub-release layer having a second adhesive strength less than the first adhesive strength.

A groove or a hole may be provided in an area of the cushion layer, which overlaps with a boundary between the first sub-release layer and the second sub-release layer when viewed in a plan view.

The protective film may further include an adhesive layer disposed between the first release layer and the cushion layer to adhere the first release layer to the cushion layer.

The compensation layer may include a glue layer disposed under the protective paper, a first antistatic layer disposed under the glue layer, a colored layer disposed under the first antistatic layer, and a second antistatic layer disposed under the colored layer.

In an aspect of the invention, a method of manufacturing a display module may include aligning a protective film, which includes a compensation layer, a first release layer disposed under the compensation layer and having a first adhesive strength, a cushion layer disposed under the first release layer, and a second release layer disposed under the cushion layer and having a second adhesive strength greater than the first adhesive strength, with a back surface of a display panel, and adhering the protective film to the display panel in such a way that the compensation layer is in contact with the back surface of the display panel.

The method may further include separating the first release layer from the compensation layer adhered to the display panel.

The first release layer may include a first sub-release layer having a third adhesive strength greater than the first adhesive strength and less than the second adhesive strength, and a second sub-release layer having the first adhesive strength. In this case, the method may further include separating the second sub-release layer from the compensation layer adhered to the display panel.

The method may further include providing a groove or a hole in an area of the cushion layer, which overlaps with a boundary between the first sub-release layer and the second sub-release layer.

In an aspect of the invention, a method of manufacturing a display device may include aligning a protective film, which includes a compensation layer, a first release layer disposed under the compensation layer, a cushion layer disposed under the first release layer, and a second release layer disposed under the cushion layer, with a back surface of a display panel, adhering the protective film to the display panel in such a way that the compensation layer is in contact with the back surface of the display panel, and separating the first release layer from the compensation layer being in contact with the display panel.

An adhesive strength of the first release layer may be less than an adhesive strength of the second release layer.

The first release layer may include a first sub-release layer having a first adhesive strength, and a second sub-release layer having a second adhesive strength less than the first adhesive strength. In this case, only the second sub-release layer of the first and second sub-release layers may be separated in the separating of the first release layer.

The method may further include providing a groove or a hole in an area of the cushion layer, which overlaps with a boundary between the first sub-release layer and the second sub-release layer.

In an aspect of the invention, a display device may include a display panel for displaying an image, a protective film adhered to a back surface of the display panel, and a bracket disposed under the protective film. The protective film may include a compensation layer being in contact with the back surface of the display panel and including a first area and a second area, a first release layer disposed under the compensation layer, and a cushion layer disposed under the first release layer. The first release layer and the cushion layer may overlap with the first area and may not overlap with the second area, when viewed in a plan view.

A concave region may be provided in an area of the bracket, which overlaps with the first area in a plan view.

A central portion of the protective film may be defined as the first area and an outer portion of the protective film may be defined as the second area, when viewed in a plan view.

BRIEF DESCRIPTION OF THE DRAWINGS

The above and other aspects and features of the present invention will become more apparent by describing in further detail exemplary embodiments thereof with reference to the accompanying drawings, in which.

DETAILED DESCRIPTION OF THE EMBODIMENTS

Figure 1:
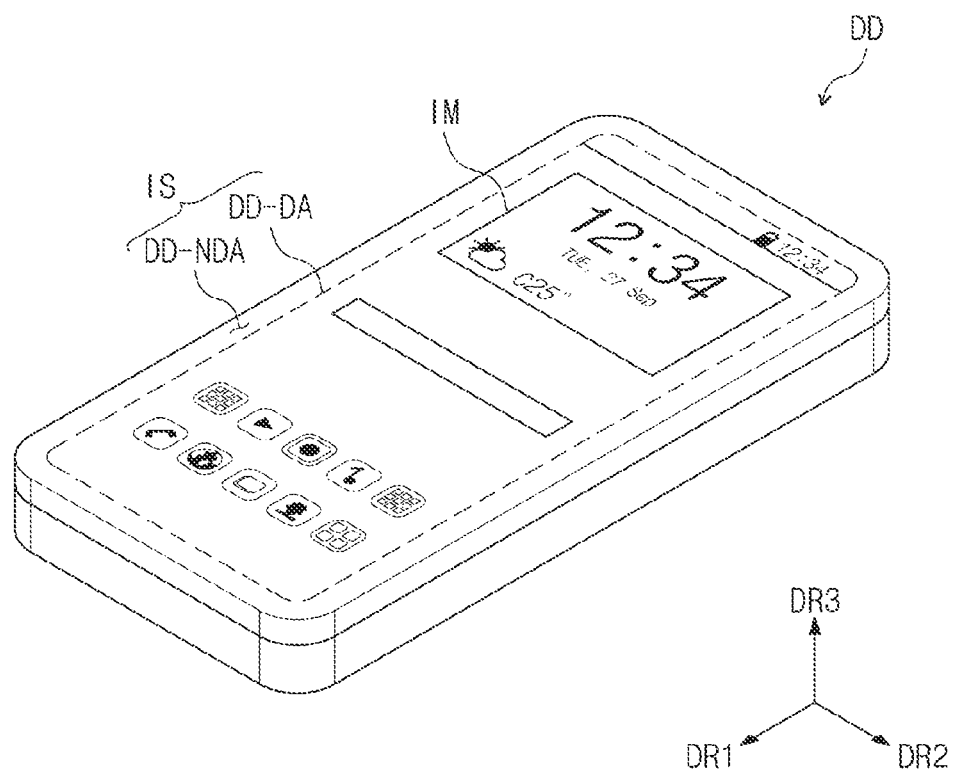
FIG. 1 is a perspective view illustrating a display device according to an embodiment of the invention.

The invention will now be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being "on" another element, it can be directly on the other element or intervening elements may be present. In contrast, the term "directly" means that there are no intervening elements. As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

FIG. 1 is a perspective view illustrating a display device according to an embodiment of the invention.

Referring to FIG. 1, a display device DD may display an image IM through a display surface IS. In FIG. 1, the display surface IS may be parallel to a plane defined by a first direction DR1 and a second direction DR2 intersecting the first direction DR1. However, embodiments of the invention are not limited thereto. In another embodiment, a display surface (not shown) of a display device (not shown) may have a bent or curved shape.

A normal direction of the display surface IS (i.e., a thickness direction of the display device DD) is indicated by a third direction DR3. A front surface (or a top surface) and a back surface (or a bottom surface) of each of members are defined by the third direction DR3. However, directions indicated by the first to third directions DR1, DR2 and DR3 may be relative concepts and may be changed into other directions. Hereinafter, first to third directions are the directions indicated by the first to third directions DR1, DR2 and DR3, respectively, and are indicated by the same reference designators.

In FIG. 1, a portable electronic device is illustrated as an example of the display device DD. However, in other embodiments, the display device DD may also be applied to large-sized electronic devices (e.g., televisions, monitors, and external billboards) and small and middle-sized electronic devices (e.g., personal computers, notebook computers, personal digital assistants (PDAs), car navigation units, game consoles, smart phones, tablets, and cameras). However, these are provided only as embodiments of the invention. In still other embodiments, the display device DD may be applied to other various electronic devices as long as they do not depart from the spirits and scopes of the invention.

The display surface IS includes a display area DD-DA in which the image IM is displayed, and a non-display area DD-NDA adjacent to the display area DD-DA. An image is not displayed in the non-display area DD-NDA. In FIG. 1, application icons are illustrated as an example of the image IM. For example, the display area DD-DA may have a quadrilateral shape (e.g., a rectangular shape). The non-display area DD-NDA may surround the display area DD-DA. However, embodiments of the invention are not limited thereto. The shapes of the display area DD-DA and the non-display area DD-NDA may have other designs. In certain embodiments, the non-display area DD-NDA may not exist in a front surface of the display device DD.

Figure 2:
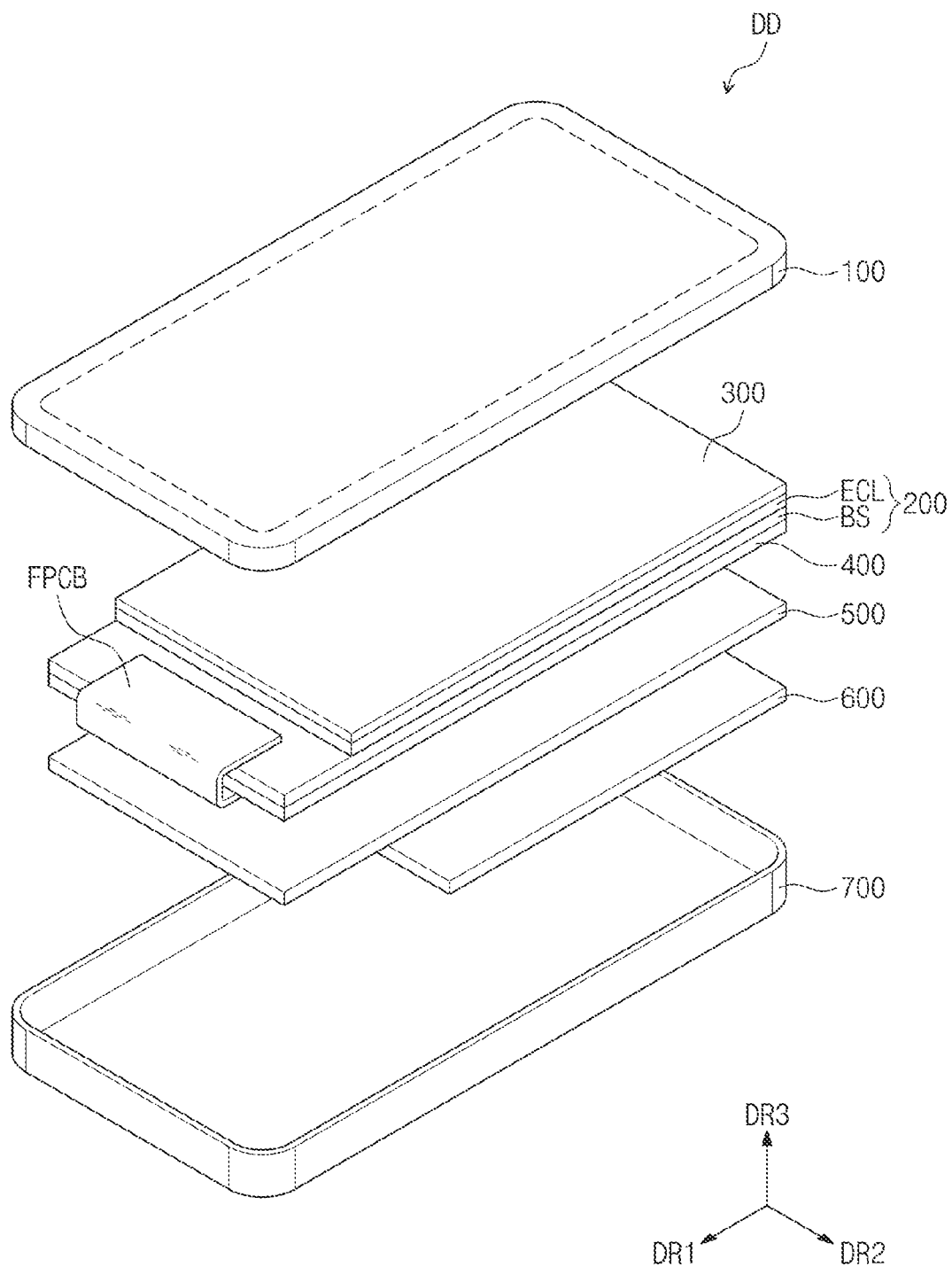
FIG. 2 is an exploded perspective view illustrating a display device according to an embodiment of the invention.
Figure 3A:
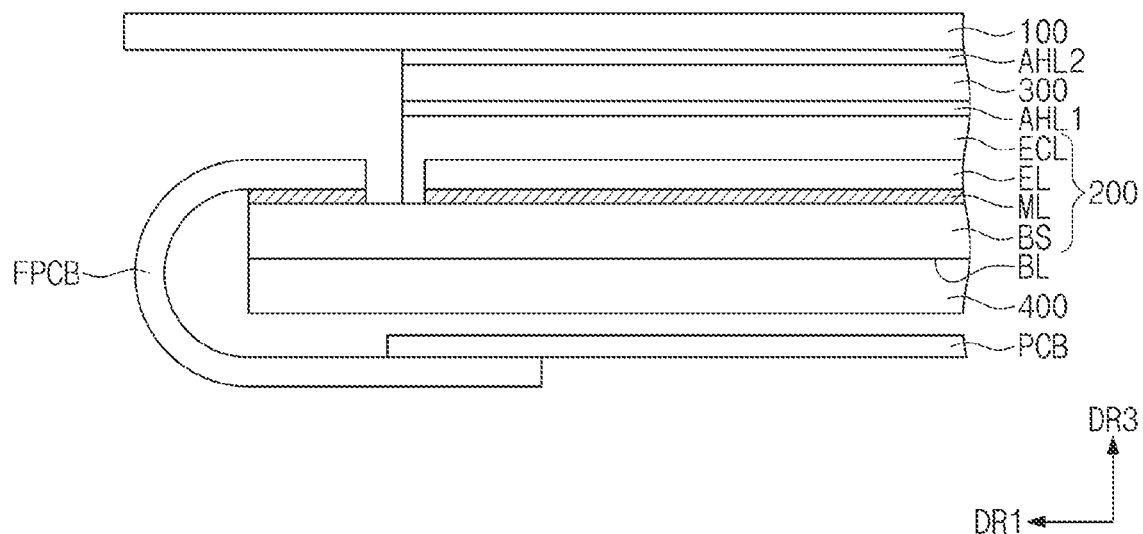
FIG. 3A is a cross-sectional view illustrating some components of a display device according to an embodiment of the invention.

FIG. 2 is an exploded perspective view illustrating the display device DD according to an embodiment of the invention, and FIG. 3A is a cross-sectional view illustrating some components of the display device DD according to an embodiment of the invention.

Referring to FIGS. 2 and 3A, the display device DD may include a window 100, a display panel 200, a sensing unit 300, a compensation layer 400, a bracket 500, an electronic component 600, and a back case 700. In FIG. 3A, the bracket 500, the electronic component 600 and the back case 700 of FIG. 2 are omitted for the purpose of ease and convenience in description and illustration.

The window 100 may be disposed over the display panel 200. The window 100 may include glass, sapphire, or plastic. However, these materials are provided only as examples of the material of the window 100, and in other embodiments, the window 100 may include a transparent material that is capable of transmitting an image (see IM of FIG. 1) provided by the display panel 200.

The display panel 200 may provide an image (see IM of FIG. 1). Hereinafter, an organic light emitting display panel will be described as an example of the display panel 200. However, embodiments of the invention are not limited thereto. In other embodiments, the display panel 200 may be a liquid crystal display panel, a plasma display panel, or an electrophoretic display panel.

The display panel 200 may include a base film BS, a circuit layer ML, a light emitting element layer EL, and a thin film encapsulation layer ECL.

The base film BS may be a flexible film or a rigid film. For example, the base film BS may include a plastic film, a glass film, a metal film, or an organic/inorganic composite film. The plastic film may include at least one of an acrylic-based resin, a methacrylic-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

The circuit layer ML may include a plurality of insulating layers, a plurality of conductive layers, and a semiconductor layer. The plurality of conductive layers of the circuit layer ML may include signal lines and/or a control circuit of a pixel.

The light emitting element layer EL may include a display element, e.g., an organic light emitting diode. However, embodiments of the invention are not limited thereto. In other embodiments, the light emitting element layer EL may include an inorganic light emitting diode or an organic-inorganic hybrid light emitting diode, depending on the type of the display panel 200.

The thin film encapsulation layer ECL encapsulates the light emitting element layer EL. The thin film encapsulation layer ECL may include a plurality of inorganic thin films and at least one organic thin film disposed therebetween. The inorganic thin films protect the light emitting element layer EL from water and oxygen, and the organic thin film protects the light emitting element layer EL from a foreign material such as dust particles.

The sensing unit 300 may be disposed on the display panel 200. The sensing unit 300 may sense an external input by a resistive film method, a mutual capacitance method, a self-capacitance method, or an electromagnetic induction method. However, the operating method of the sensing unit 300 is not limited to these embodiments.

The external input provided from the outside may be various and may be, for example, a part of a body of a user, a stylus pen, light, heat, or pressure. In addition, the sensing unit 300 may sense a touch of a part (e.g., a finger) of a body of a user and may also sense an approaching spatial touch (e.g., a hovering touch). The sensing unit 300 according to the embodiment of the invention may sense at least one of various kinds of touches and is not limited to a specific embodiment.

A first adhesive member AHL1 may be disposed between the display panel 200 and the sensing unit 300, and a second adhesive member AHL2 may be disposed between the sensing unit 300 and the window 100. Each of the first and second adhesive members AHL1 and AHL2 may be an organic adhesive layer such as an optically clear adhesive (OCA) film, an optically clear resin (OCR), or a pressure sensitive adhesive (PSA) film. The organic adhesive layer may include an adhesive material such as a polyurethane-based adhesive material, a polyacryl-based adhesive material, a polyester-based adhesive material, a polyepoxy-based adhesive material, or a polyacetate vinyl-based adhesive material.

The compensation layer 400 may be disposed under the display panel 200. The compensation layer 400 may be adhered to a back surface BL of the display panel 200. The compensation layer 400 may block static electricity provided from the outside or static electricity provided in an electrostatic discharge (ESD) test. The compensation layer 400 may include a colored layer to prevent light incident on the compensation layer 400 from being reflected again to the outside, and thus components disposed under the display panel 200 may not be visible.

The display device DD may further include a flexible printed circuit board FPCB and a printed circuit board PCB.

The flexible printed circuit board FPCB electrically connects the display panel 200 to the printed circuit board PCB. One end of the flexible printed circuit board FPCB may be connected to a surface of the base film BS exposed by the thin film encapsulation layer ECL, and another end of the flexible printed circuit board FPCB may be connected to the printed circuit board PCB. The flexible printed circuit board FPCB may be flexibly provided to be bent toward the back surface BL of the display panel 200 in a state in which the flexible printed circuit board FPCB is connected or coupled to the display panel 200 and the printed circuit board PCB.

The printed circuit board PCB may transmit signals to the display panel 200 through the flexible printed circuit board FPCB and/or may receive signals from the display panel 200 through the flexible printed circuit board FPCB. Since the flexible printed circuit board FPCB is bent, the printed circuit board PCB may be disposed under the display panel 200 in a state in which the printed circuit board PCB is connected or coupled to the flexible printed circuit board FPCB. A connector (not shown) for receiving signals from an external system may be connected to the printed circuit board PCB.

The bracket 500 may be disposed under the display panel 200 to support the display panel 200. The back case 700 may be coupled to the window 100 to receive the display panel 200. The back case 700 may include plastic or metal. A space may be defined between the bracket 500 and the back case 700, and the electronic component 600 may be disposed in the space. The electronic component 600 may be, for example, a battery and/or a camera module.

Figure 3B:
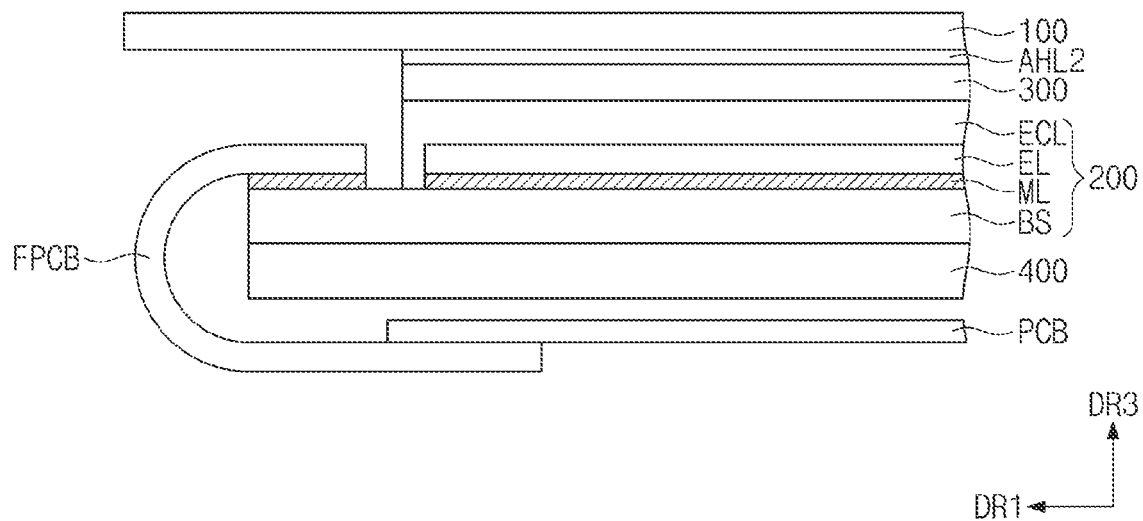
FIG. 3B is a cross-sectional view illustrating some components of a display device according to an embodiment of the invention.

FIG. 3B is a cross-sectional view illustrating some components of a display device according to an embodiment of the invention. In the embodiment of FIG. 3B, the same components as in the embodiment of FIG. 3A will be indicated by the same reference numerals or designators, and the descriptions thereto will be omitted.

Referring to FIG. 3B, the display panel 200 and the sensing unit 300 may be manufactured by continuous processes. Thus, the first adhesive member AHL1 illustrated in FIG. 3A may be omitted in the present embodiment. In this case, the thin film encapsulation layer ECL may further include a buffer layer. The buffer layer may be a layer closest to the sensing unit 300. The buffer layer may be an inorganic layer or an organic layer. The inorganic layer may include at least one of silicon nitride, silicon oxynitride, silicon oxide, titanium oxide, or aluminum oxide. The organic layer may include a polymer, e.g., an acrylic-based organic layer. However, embodiments of the invention are not limited thereto.

Figure 4:
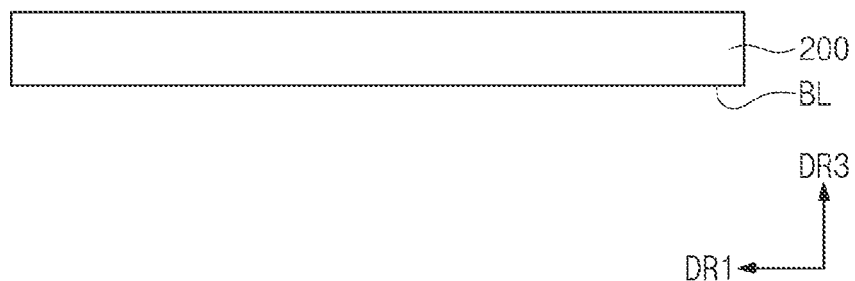
FIGS. 4 and 5 are cross-sectional views illustrating a method of manufacturing a display module according to an embodiment of the invention.
Figure 5:
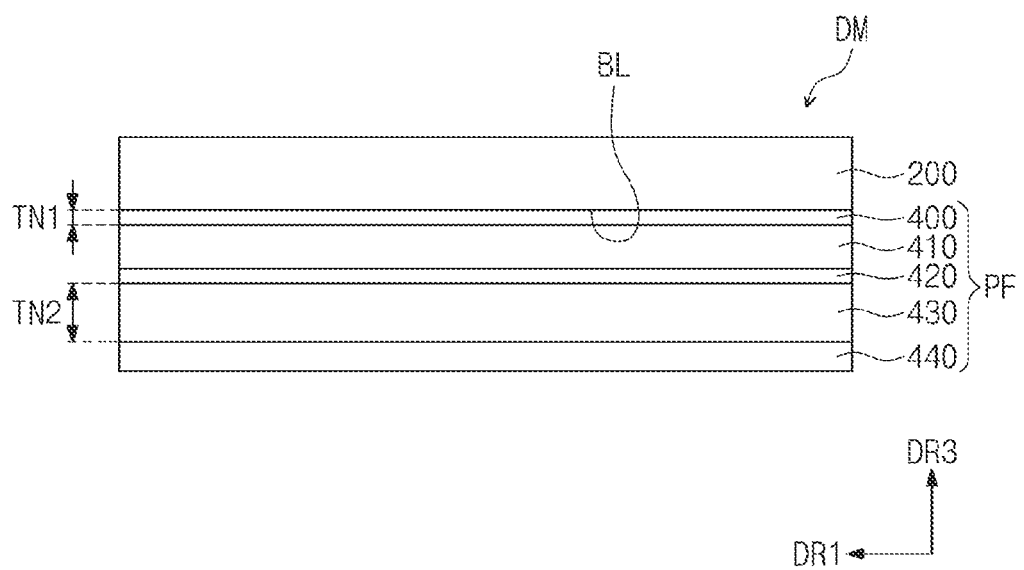

FIGS. 4 and 5 are cross-sectional views illustrating a method of manufacturing a display module according to an embodiment of the invention.

Referring to FIG. 4, a display panel 200 is provided. The display panel 200 is the same as described above with reference to FIG. 3A.

In FIG. 4, only the display panel 200 is illustrated. However, the display panel 200 may be provided in a state in which the flexible printed circuit board FPCB (see FIG. 3A) and the printed circuit board PCB (see FIG. 3A) are adhered to the display panel 200. Alternatively, the display panel 200 may be provided before the flexible printed circuit board FPCB and the printed circuit board PCB are adhered to the display panel 200. In other embodiments, the sensing unit 300 (see FIG. 3A) and the display panel 200 adhered to each other may be provided, or the display panel 200 may be provided before the sensing unit 300 (see FIG. 3A) is adhered to the display panel 200. In still other embodiments, the display panel 200 may be provided after the sensing unit 300 (see FIG. 3B) is formed on the display panel 200.

Referring to FIG. 5, a protective film PF may be aligned with the back surface BL of the display panel 200. The protective film PF may include a compensation layer 400, a first release layer 410, an adhesive layer 420, a cushion layer 430, and a second release layer 440.

The first release layer 410 may be disposed under the compensation layer 400, and the adhesive layer 420 may be disposed under the first release layer 410. The cushion layer 430 may be disposed under the adhesive layer 420, and the second release layer 440 may be disposed under the cushion layer 430.

The protective film PF may be adhered to the display panel 200 in such a way that the compensation layer 400 is in contact with the back surface BL of the display panel 200.

The back surface BL of the display panel 200 may be a surface opposite to a surface on which an image is displayed. The protective film PF may be adhered to the back surface BL of the display panel 200 to form a display module DM.

Even though not shown in FIG. 5, a protective paper may further be provided on the compensation layer 400. In this case, to adhere the compensation layer 400 to the back surface BL of the display panel 200, the method of manufacturing the display module may further include an operation of removing the protective paper.

The compensation layer 400 may be an optical compensation layer that blocks static electricity and/or prevents components disposed under the display panel 200 from being visible to a user.

The compensation layer 400 may be adhered to one surface of the first release layer 410, and the cushion layer 430 may be disposed on another surface of the first release layer 410 with the adhesive layer 420 interposed therebetween. In the event that the cushion layer 430 includes with it an adhesive layer, the separately provided adhesive layer 420 may be omitted. An adhesive strength of the first release layer 410 may be 4 gf/25 mm or less.

The adhesive layer 420 may include an adhesive material such as a polyurethane-based adhesive material, a polyacryl-based adhesive material, a polyester-based adhesive material, a polyepoxy-based adhesive material, or a polyacetate vinyl-based adhesive material. However, the material of the adhesive layer 420 is not limited thereto.

The cushion layer 430 may include polymer resin foam. For example, the cushion layer 430 may include foam formed of polyurethane, polycarbonate, polypropylene, polyethylene, or polyolefin. However, the material of the cushion layer 430 is not limited thereto.

The second release layer 440 is adhered to the cushion layer 430. An adhesive strength of the second release layer 440 may be greater than the adhesive strength of the first release layer 410. For example, the adhesive strength of the second release layer 440 may be 150 or more times greater than the adhesive strength of the first release layer 410. However, the 150 times is merely an example for explaining a large difference in adhesive strength. The second release layer 440 may have an adhesive strength of 700 gf/25 mm or more. For example, the second release layer 440 may have an adhesive strength of 731 gf/25 mm.

Thereafter, the display module DM may be assembled with various sets of components to realize various types of the display devices DD (see FIG. 1). The state in which the protective film PF is adhered to the display panel 200 may be maintained before the display module DM is assembled with the set.

In an embodiment of the invention, a first thickness TN1 of the compensation layer 400 may be less than a second thickness TN2 of the cushion layer 430. For example, the first thickness TN1 of the compensation layer 400 may be 0.03 mm, and the second thickness TN2 of the cushion layer 430 may be 0.1 mm or more.

The display device DD (see FIG. 1) may become thinner. Therefore, if only the compensation layer 400 is adhered to the display panel 200, various types of defects may occur before assembling the set since the compensation layer 400 is thin. For example, an appearance of the display module DM may be damaged by a stab during movement. In particular, when the base film BS (see FIG. 3A) is a flexible film, malfunction of the display panel 200 may occur due to the appearance damage. However, according to the embodiments of the invention, the cushion layer 430 having a thickness of 0.1 mm or more is provided under the compensation layer 400. Thus, the display panel 200 may be protected by the cushion layer 430 before the display module DM is assembled with the set.

The first release layer 410 may be separated from the compensation layer 400 adhered to the display panel 200 before the set assembly, and thus the first release layer 410, the adhesive layer 420, the cushion layer 430 and the second release layer 440 may be separated from the display panel 200. Thus, when the thinned display device DD (see FIG. 1) is manufactured, it is possible to inhibit or prevent defects from occurring at the display module DM before assembling the set.

Figure 6:
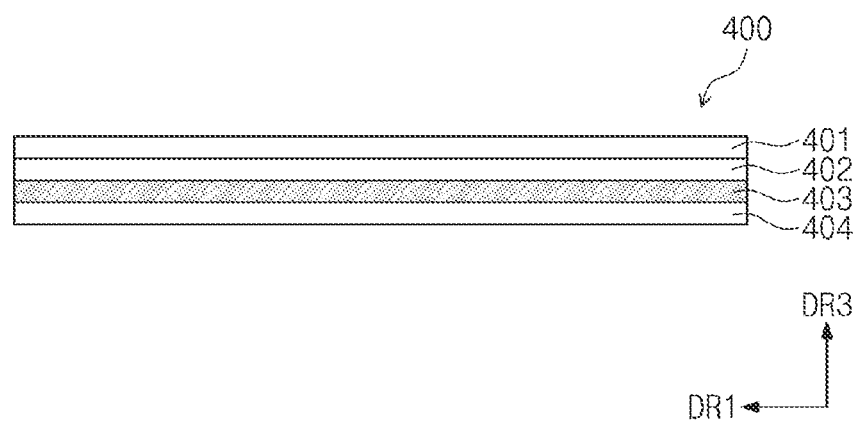
FIG. 6 is a cross-sectional view illustrating a compensation layer according to an embodiment of the invention.

FIG. 6 is a cross-sectional view illustrating a compensation layer according to an embodiment of the invention. However, components of the compensation layer 400 are not limited to FIG. 6 but may be variously modified or changed.

Referring to FIGS. 5 and 6, the compensation layer 400 may include a glue layer 401, a first antistatic layer 402, a colored layer 403, and a second antistatic layer 404.

The glue layer 401 may be adhered to the back surface BL of the display panel 200. The glue layer 401 may include a silicone adhesive.

The first antistatic layer 402 and the second antistatic layer 404 may block the static electricity provided from the outside and/or the static electricity provided in the ESD test. In other embodiments of the invention, one of the first antistatic layer 402 and the second antistatic layer 404 may be omitted, or both the first antistatic layer 402 and the second antistatic layer 404 may be omitted.

The colored layer 403 may prevent light incident on the compensation layer 400 from being reflected again to the outside, and thus components disposed under the display panel 200 may not be visible. The colored layer 403 may include blue ink or black ink. However, the color of the colored layer 403 is not limited thereto. The colored layer 403 may be provided by printing the blue ink or the black ink onto the first antistatic layer 402 or the second antistatic layer 404.

Figure 7:
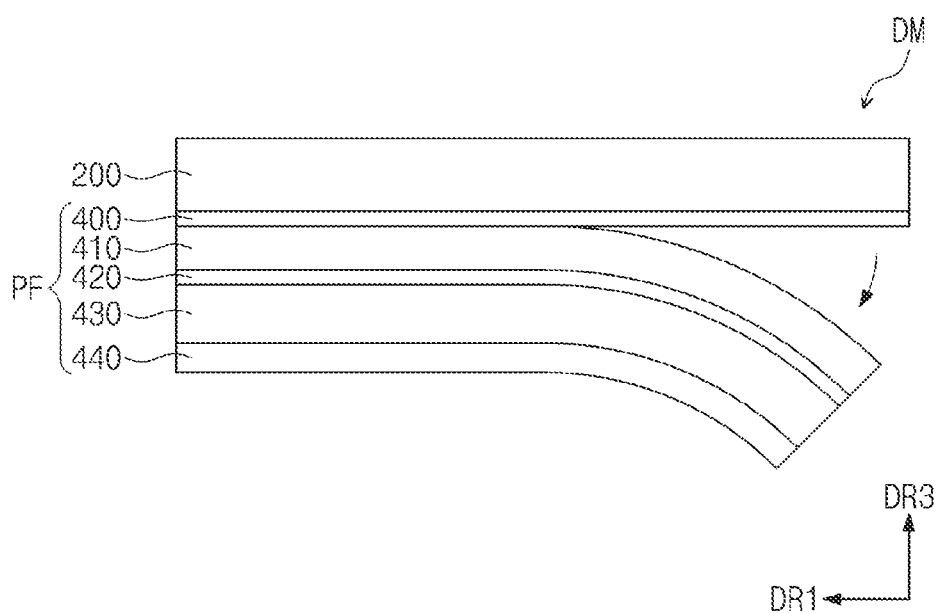
FIG. 7 is a cross-sectional view illustrating an operation of separating some of components of a protective film from a display module before assembling a set.

FIG. 7 is a cross-sectional view illustrating an operation of separating some components of the protective film PF from the display module DM before assembling the set.

Referring to FIG. 7, the first release layer 410 of the protective film PF may be separated from the display panel 200 and the compensation layer 400, as described above. In other words, the cushion layer 430 protecting the back surface of the display panel 200 may be separated from the compensation layer 400 before assembling the set.

Even though only the compensation layer 400 is disposed on the back surface of the display panel 200 by the demand for thinning the display device DD (see FIG. 1), the display panel 200 is protected by the cushion layer 430 before the display panel 200 is assembled in the set. Thus, an occurrence rate of defects of the display module DM may be reduced or minimized.

Figure 8:
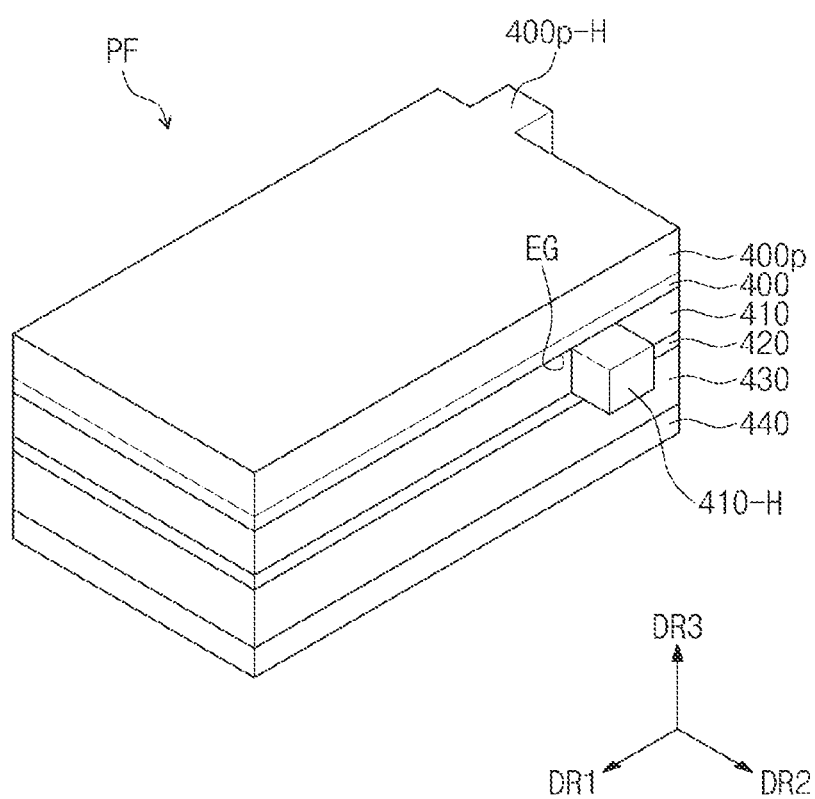
FIG. 8 is a perspective view illustrating a protective film according to an embodiment of the invention.

FIG. 8 is a perspective view illustrating a protective film PF according to an embodiment of the invention.

A protective paper 400p disposed on the compensation layer 400 is further illustrated in the protective film PF of FIG. 8. The protective paper 400p may be removed before the protective film PF is adhered to the display panel 200 (see FIG. 7). A grip portion 400p-H may further be provided to the protective paper 400p to easily separate the protective paper 400p from the compensation layer 400.

A grip portion 410-H may be provided to easily separate the first release layer 410, the adhesive layer 420, the cushion layer 430 and the second release layer 440 from the compensation layer 400 before assembling the set.

The grip portion 410-H may be connected to the first release layer 410. For example, the grip portion 410-H may protrude from one edge EG of the first release layer 410 when viewed in a plan view. In an embodiment of the invention, the grip portion 410-H may be a component included in the first release layer 410.

In FIG. 8, one surface of the grip portion 410-H has a rectangular shape. However, embodiments of the invention are not limited thereto. A position, a shape and a size of the grip portion 410-H may be modified in other embodiments.

The grip portion 400p-H of the protective paper 400p and the grip portion 410-H of the first release layer 410 may be disposed at different positions from each other when viewed in a plan view.

Figure 9:
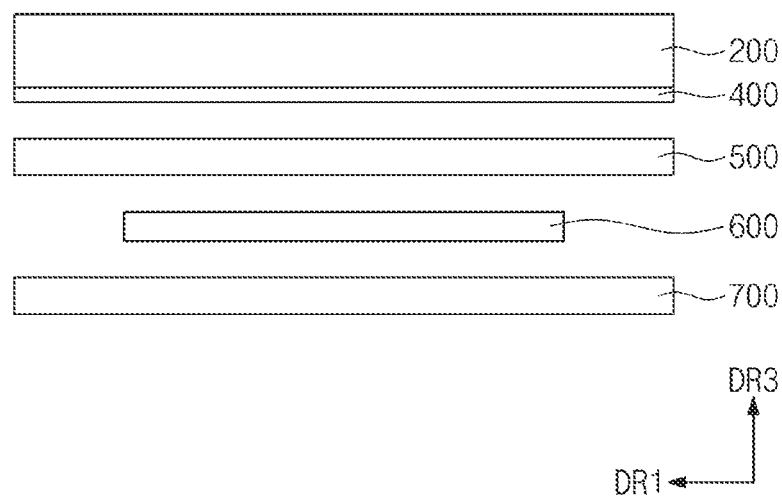
FIG. 9 is a cross-sectional view illustrating an operation of assembling a set according to an embodiment of the invention.

FIG. 9 is a cross-sectional view illustrating an operation of assembling a set according to an embodiment of the invention.

As illustrated in FIG. 7, the first release layer 410, the adhesive layer 420, the cushion layer 430 and the second release layer 440 are separated from the display panel 200 except the compensation layer 400. Thereafter, the bracket 500, the electronic component 600 and the back case 700 may be coupled to the back surface of the display panel 200 to which the compensation layer 400 is adhered, thereby constituting or assembling the set. However, embodiments of the invention are not limited thereto. The method of assembling the set may be modified in other embodiments. For example, the bracket 500 may be omitted in certain embodiments.

Figure 10:
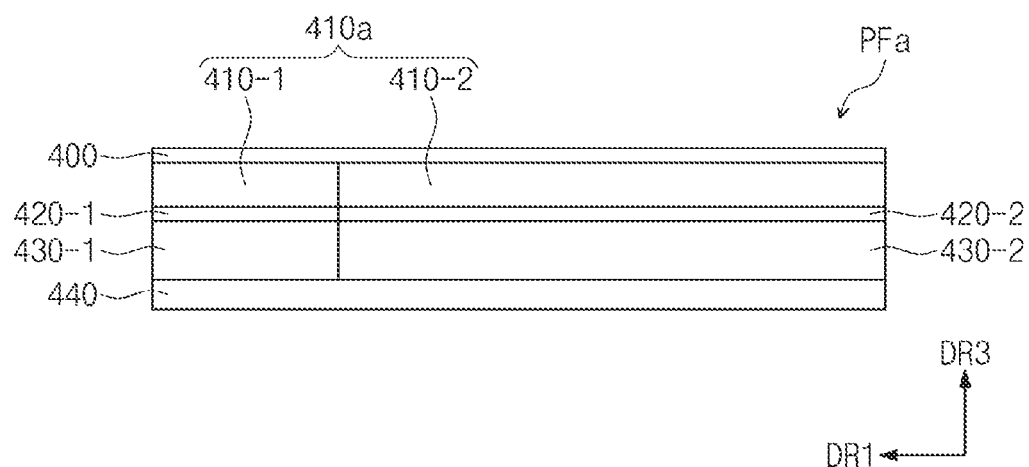
FIG. 10 is a cross-sectional view illustrating a protective film according to an embodiment of the invention.

FIG. 10 is a cross-sectional view illustrating a protective film PFa according to an embodiment of the invention. In the embodiment of FIG. 10, the same components as in the embodiment of FIG. 5 will be indicated by the same reference numerals or designators, and the descriptions thereto will be omitted.

The protective film PFa may include the compensation layer 400, a first release layer 410a, an adhesive layer 420-1 and 420-2, a cushion layer 430-1 and 430-2, and the second release layer 440.

The first release layer 410a may include a first sub-release layer 410-1 having a first adhesive strength and a second sub-release layer 410-2 having a second adhesive strength less than the first adhesive strength.

The first adhesive strength of the first sub-release layer 410-1 may be greater than the second adhesive strength of the second sub-release layer 410-2 and may be less than the adhesive strength of the second release layer 440. For example, the second adhesive strength of the second sub-release layer 410-2 may be 4 gf/25 mm or less, and the adhesive strength of the second release layer 440 may be 700 gf/25 mm or more. Thus, the first adhesive strength of the first sub-release layer 410-1 may be greater than 4 gf/25 mm and less than 700 gf/25 mm. In particular, the first adhesive strength of the first sub-release layer 410-1 may range from 100 gf/25 mm to 300gf/25 mm.

Figure 11:
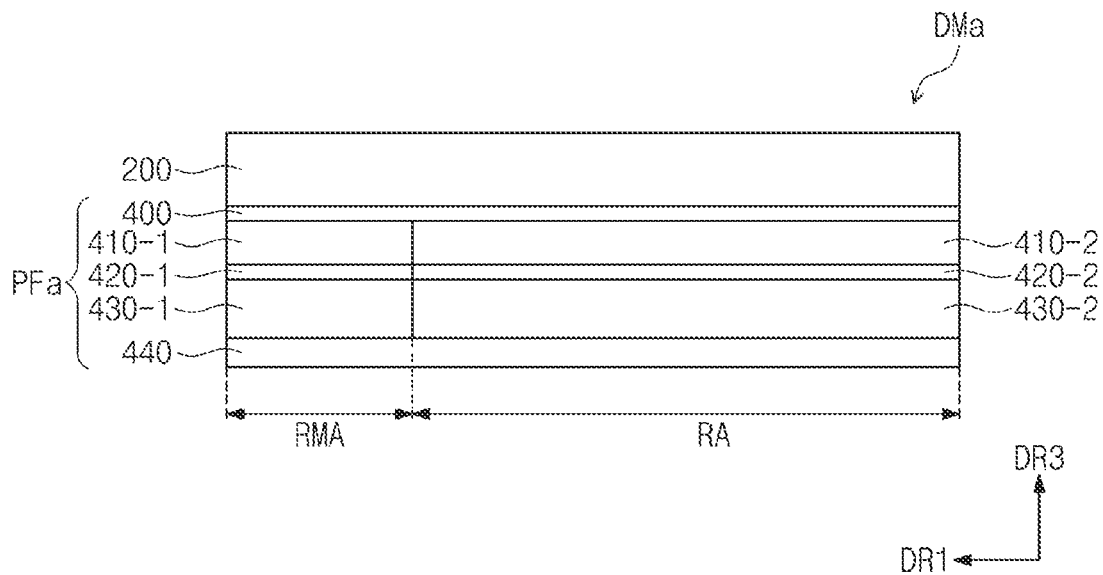
FIG. 11 is a cross-sectional view illustrating a display module according to an embodiment of the invention.
Figure 12:
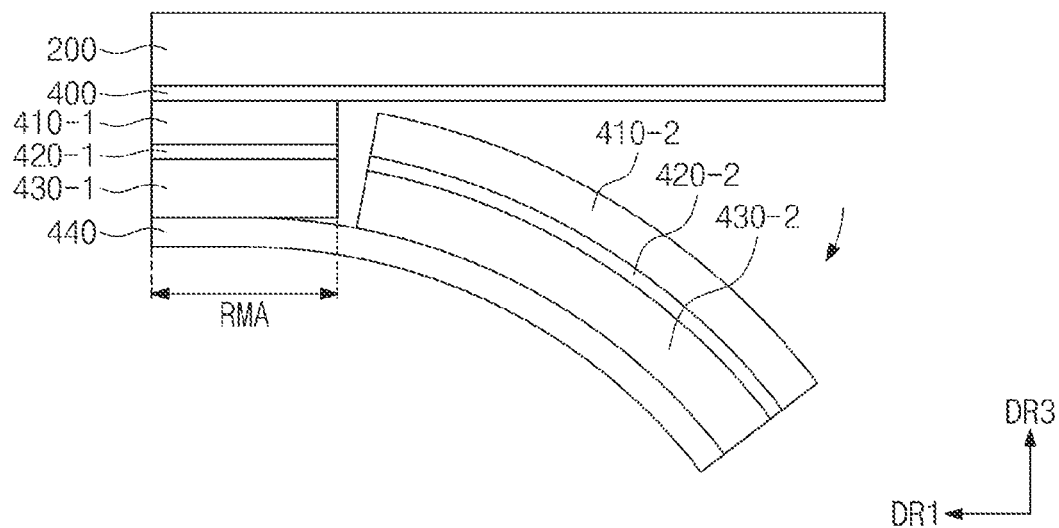
FIG. 12 is a cross-sectional view illustrating an operation of separating some components of a protective film from a display module before assembling a set.
Figure 13:
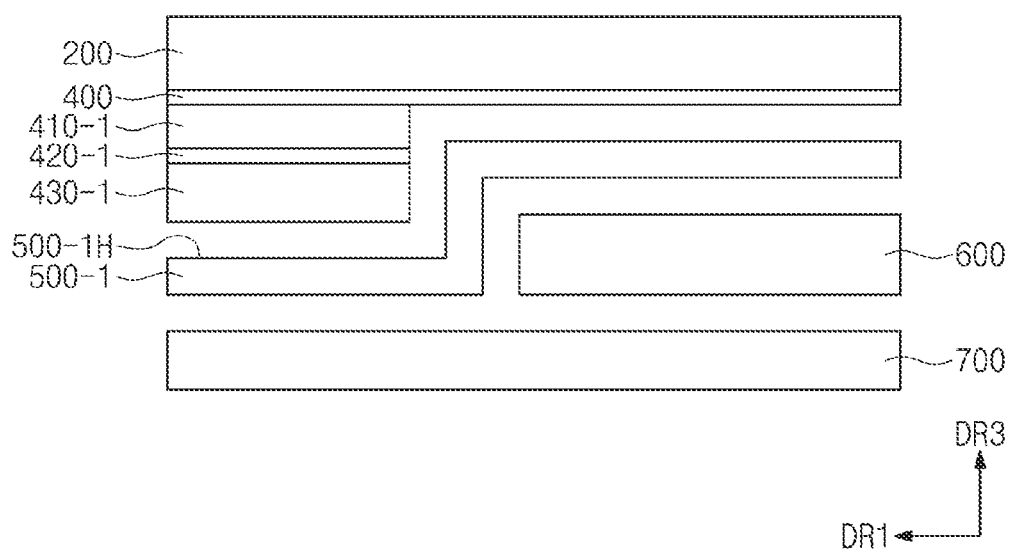
FIG. 13 is a cross-sectional view illustrating an operation of assembling a set according to an embodiment of the invention.

FIG. 11 is a cross-sectional view illustrating a display module DMa according to an embodiment of the invention, FIG. 12 is a cross-sectional view illustrating an operation of separating some components of a protective film from the display module DMa before assembling a set, and FIG. 13 is a cross-sectional view illustrating an operation of assembling a set according to an embodiment of the invention.

Referring to FIGS. 11 to 13, a protective film PFa is adhered to the back surface of the display panel 200 to form a display module DMa. The protective film PFa is the same as described above with reference to FIG. 10.

The protective film PFa may include a first area RMA and a second area RA. The first area RMA may be defined as an area overlapping with the first sub-release layer 410-1 and the second area RA may be defined as an area overlapping with the second sub-release layer 410-2, when viewed in a plan view. Here, when an component is viewed in the plan view, it may be viewed in a direction parallel to the third direction DR3.

Portions, overlapping with the first area RMA, of the adhesive layer 420-1 and 420-2 and the cushion layer 430-1 and 430-2 are defined as a first adhesive layer 420-1 and a first cushion layer 430-1, respectively. Portions, overlapping with the second area RA, of the adhesive layer 420-1 and 420-2 and the cushion layer 430-1 and 430-2 are defined as a second adhesive layer 420-2 and a second cushion layer 430-2, respectively.

In FIG. 12, the second sub-release layer 410-2 is separated from the compensation layer 400 before assembling a set. In other words, the second sub-release layer 410-2, the second adhesive layer 420-2, the second cushion layer 430-2 and the second release layer 440 may be separated from the display panel 200. Thus, the compensation layer 400, the first sub-release layer 410-1, the first adhesive layer 420-1 and the first cushion layer 430-1 may remain on the back surface of the display panel 200.

Referring to FIG. 13, a bracket 500-1, the electronic component 600 and the back case 700 may be coupled to the back surface of the display panel 200 to assemble a set.

The compensation layer 400 is adhered to an entire portion of the back surface of the display panel 200, and the first sub-release layer 410-1, the first adhesive layer 420-1 and the first cushion layer 430-1 are disposed under only a partial area of the compensation layer 400. The first sub-release layer 410-1, the first adhesive layer 420-1 and the first cushion layer 430-1 may overlap with the first area RMA (see FIG. 11) but may not overlap with the second area RA (see FIG. 11), when viewed in a plan view.

A concave region 500-1H may be provided at the bracket 500-1. A position of the concave region 500-1H may correspond to a position at which the first sub-release layer 410-1, the first adhesive layer 420-1 and the first cushion layer 430-1 are disposed. For example, the concave region 500-1H may overlap with the first area RMA (see FIG. 11) when viewed in a plan view.

A space in which a cushion layer will be adhered may be provided on a partial area of the back surface of the display panel 200 by the concave region 500-1H of the bracket 500-1. Thus, the second sub-release layer 410-2, the second adhesive layer 420-2 and the second cushion layer 430-2 may be removed from a partial area (e.g., the second area RA) to satisfy the demand for thinning the display device DD (see FIG. 1), and the first sub-release layer 410-1, the first adhesive layer 420-1 and the first cushion layer 430-1 may remain in another partial area (e.g., the first area RMA).

Figure 14:
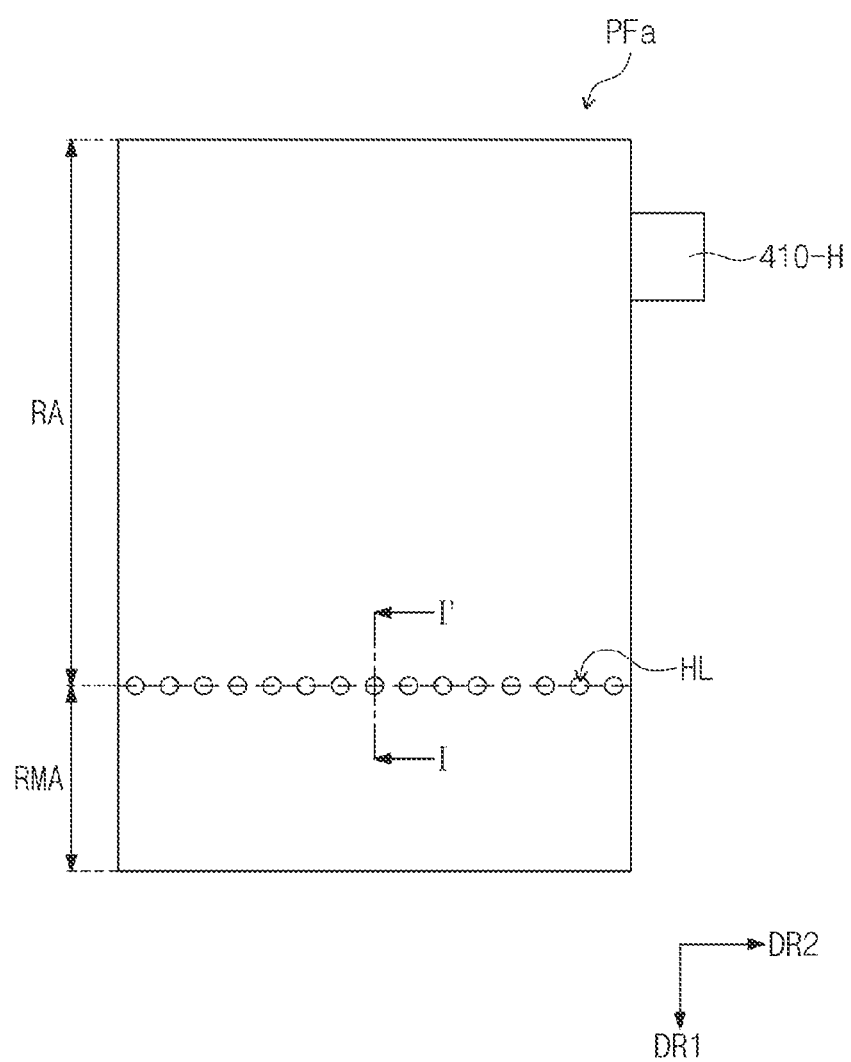
FIG. 14 is a plan view illustrating a protective film according to an embodiment of the invention.

FIG. 14 is a plan view illustrating a protective film PFa according to an embodiment of the invention.

Referring to FIGS. 11 and 14, a hole HL may be defined at a boundary between the first area RMA and the second area RA of the protective film PFa. The hole HL is illustrated by a solid line at the boundary of the first area RMA and the second area RA to clarify the understanding. However, the hole HL is not necessarily formed in all components or an outermost component of the protective film PFa. This will be described in detail with reference to FIGS. 15A and 15B.

The grip portion 410-H of the protective film PFa may extend from the second sub-release layer 410-2 described above. The second sub-release layer 410-2 may be easily separated from the compensation layer 400 by using the grip portion 410-H.

Figure 15A:
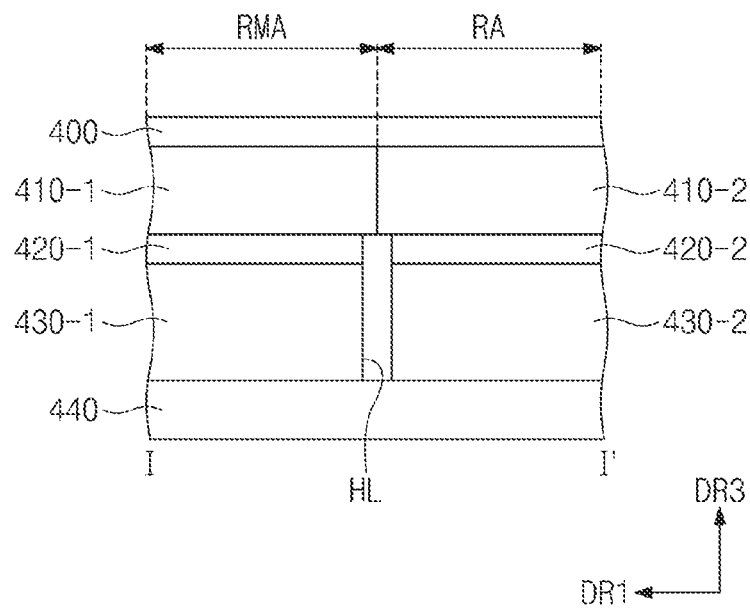
FIG. 15A is a cross-sectional view taken along a line I-I' of FIG. 14.
Figure 15B:
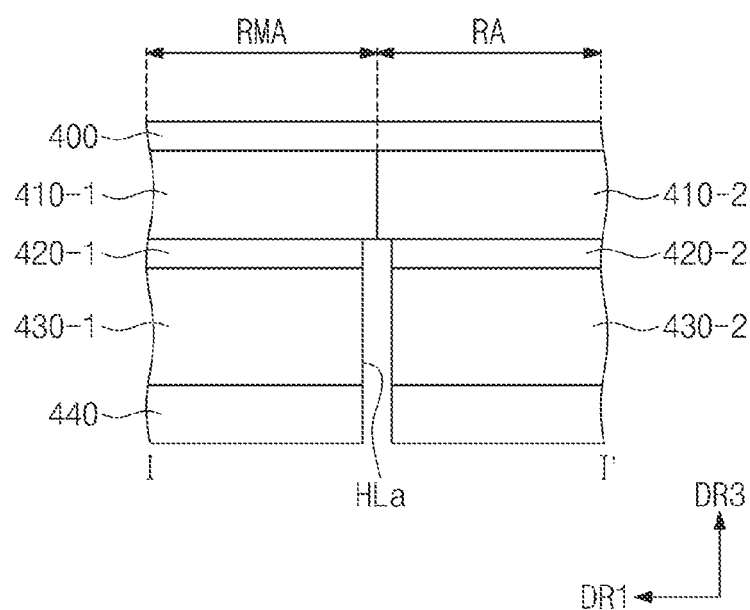
FIG. 15B is a cross-sectional view taken along the line I-I' of FIG. 14 to illustrate a protective film according to another embodiment of the invention.

FIGS. 15A and 15B are cross-sectional views taken along a line I-I' of FIG. 14.

Referring to FIG. 15A, the hole HL may be provided at a boundary between the first adhesive layer 420-1 and the second adhesive layer 420-2 and a boundary between the first cushion layer 430-1 and the second cushion layer 430-2 to easily separate the second adhesive layer 420-2 and the second cushion layer 430-2 from the first adhesive layer 420-1 and the first cushion layer 430-1. Since the second release layer 440 is removed before assembling the set, the hole HL may not be provided in the second release layer 440.

Referring to FIG. 15B, a hole HLa may extend into the second release layer 440.

Even though not shown in the drawings, in another embodiment of the invention, the first adhesive layer 420-1 and the second adhesive layer 420-2 may be provided separately, and the first cushion layer 430-1 and the second cushion layer 430-2 may be provided separately. In other words, the first adhesive layer 420-1 may be disposed separately from the second adhesive layer 420-2, and the first cushion layer 430-1 may be disposed separately from the second cushion layer 430-2. In still another embodiment of the invention, one of the boundary of the first and second adhesive layers 420-1 and 420-2 and the boundary of the first and second cushion layers 430-1 and 430-2 may be cut, and a hole may be provided at the other of the boundary of the first and second adhesive layers 420-1 and 420-2 and the boundary of the first and second cushion layers 430-1 and 430-2.

Figure 16:
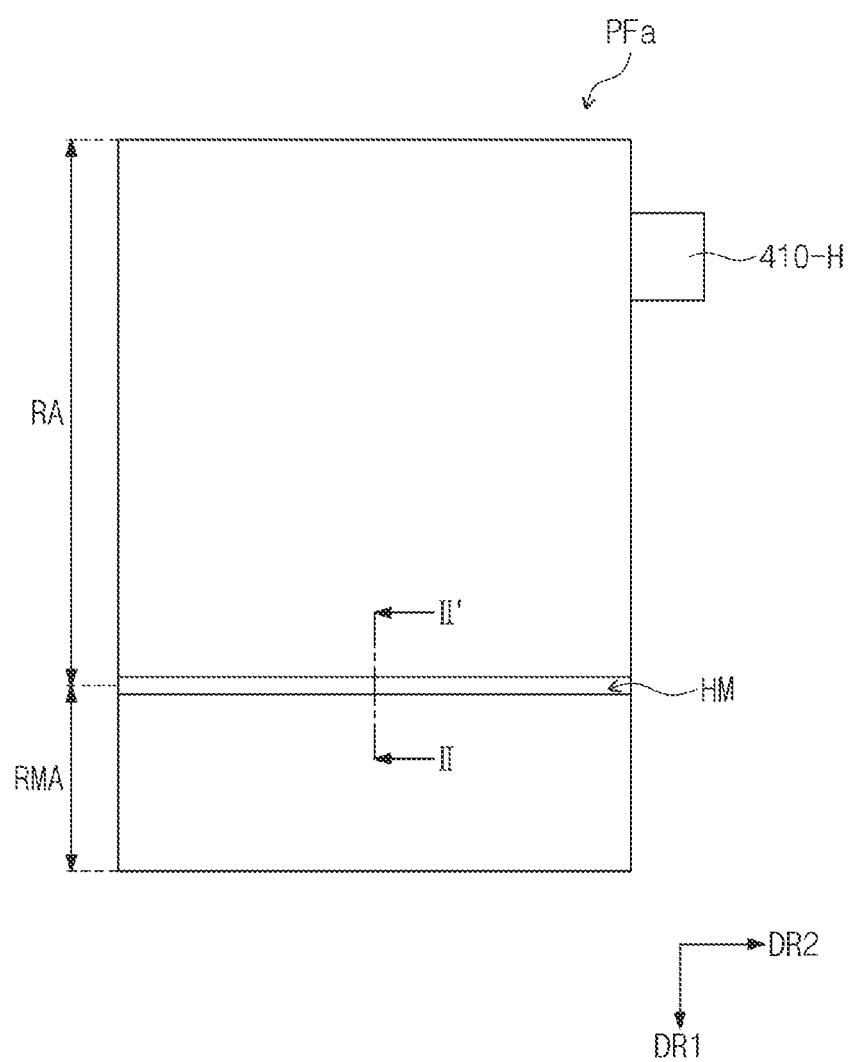
FIG. 16 is a plan view illustrating a protective film according to an embodiment of the invention.
Figure 17:
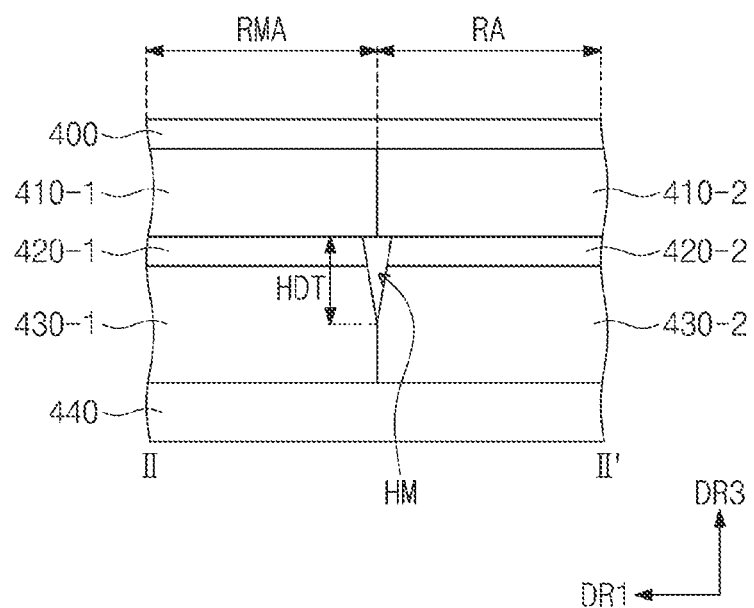
FIG. 17 is a cross-sectional view taken along a line II-II' of FIG. 16.

FIG. 16 is a plan view illustrating a protective film according to an embodiment of the invention, and FIG. 17 is a cross-sectional view taken along a line II-II' of FIG. 16.

Referring to FIG. 16, a groove HM may be provided at the boundary between the first area RMA and the second area RA of the protective film PFa. The groove HM is illustrated at the boundary between the first area RMA and the second area RA for the purpose of ease and convenience in description and illustration. However, the groove HM is not necessarily provided in all components or an outermost component of the protective film PFa.

Referring to FIG. 17, the groove HM may be provided at the boundary between the first adhesive layer 420-1 and the second adhesive layer 420-2 and the boundary between the first cushion layer 430-1 and the second cushion layer 430-2. FIG. 17 illustrates the groove HM which penetrates the boundary between the first and second adhesive layers 420-1 and 420-3 and extends into a portion of the boundary between the first and second cushion layers 430-1 and 430-2. However, embodiments of the invention are not limited thereto. A depth HDT of the groove HM may be variously adjusted. In other words, in FIG. 17, the depth HDT of the groove HM is greater than a thickness of the first adhesive layer 420-1 and is less than a sum of the thickness of the first adhesive layer 420-1 and a thickness of the first cushion layer 430-1. However, embodiments of the invention are not limited thereto. In another embodiment of the invention, the depth HDT of the groove HM may be equal to the sum of the thickness of the first adhesive layer 420-1 and the thickness of the first cushion layer 430-1. In still another embodiment of the invention, the depth HDT of the groove HM may be greater than the sum of the thickness of the first adhesive layer 420-1 and the thickness of the first cushion layer 430-1, and thus the groove HM may also be provided in the second release layer 440. In yet other embodiments, the groove HM may be provided in only an area corresponding to the boundary between the first and second adhesive layers 420-1 and 420-2 or may be provided in only an area corresponding to the boundary between the first and second cushion layers 430-1 and 430-2.

Figure 18:
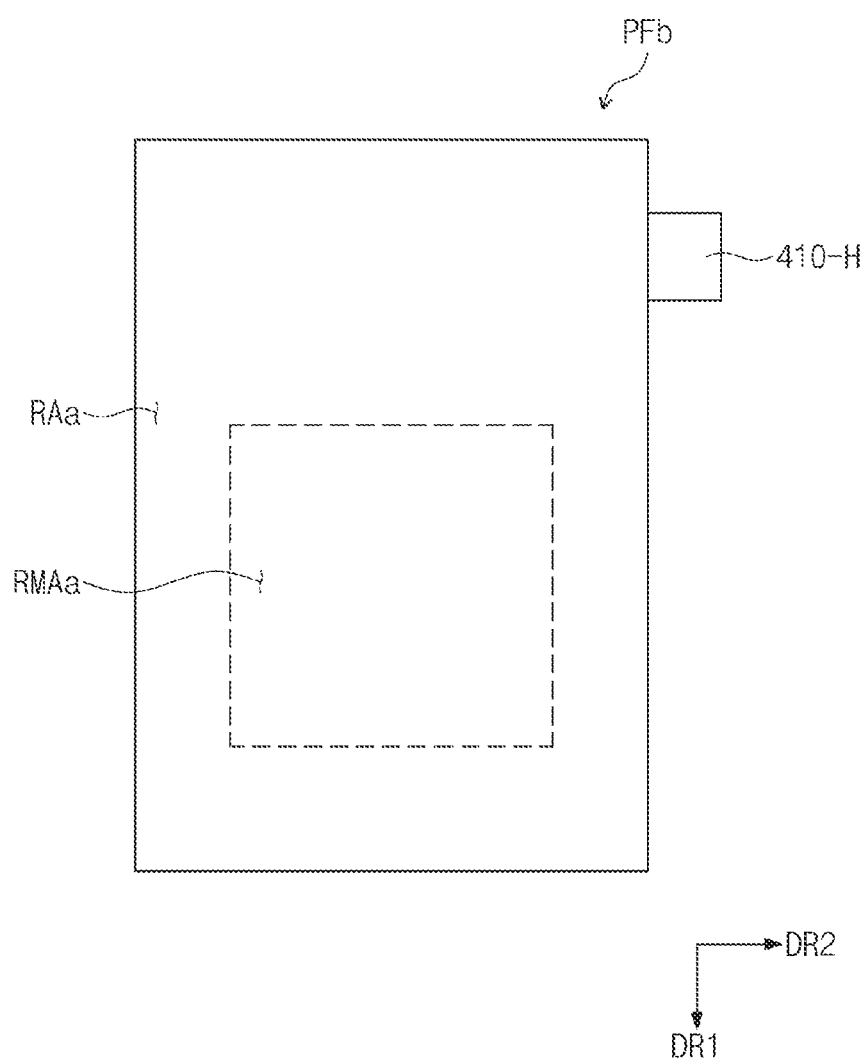
FIG. 18 is a plan view illustrating a protective film according to an embodiment of the invention.

FIG. 18 is a plan view illustrating a protective film according to an embodiment of the invention.

FIG. 18 illustrates an embodiment in which positions of a first area RMAa and a second area RAa of a protective film PFb can be variously changed depending on a design.

For example, the thin display device DD (see FIG. 1) may be provided by reducing a thickness of an outermost portion of the display device DD (see FIG. 1). In this case, a space in which the cushion layer will be disposed may be defined in an area corresponding to a central portion of the display device DD (see FIG. 1).

Thus, as illustrated in FIG. 18, the first area RMAa may be defined in a central portion of the protective film PFb, and the second area RAa may be defined in an outer portion of the protective film PFb. As described above with reference to FIGS. 10 to 12, a first release layer, an adhesive layer and a cushion layer of the protective film PFb, which overlap with the first area RMAa in a plan view, may be provided to be adhered to the display panel 200 (see FIG. 4). On the other hand, the first release layer, the adhesive layer and the cushion layer of the protective film PFb, which overlap with the second area RAa in a plan view, may be separated from the compensation layer. In addition, even though not shown in the drawings, the groove or the hole may be provided at a boundary between the first area RMAa and the second area RAa, as described with reference to FIGS. 14 to 17.

Display devices are becoming thinner Thus, if only a compensation layer is adhered to a display panel in a display module, various types of defects may occur by a thin thickness of the compensation layer before assembling a set. For example, an appearance of the display module may be damaged by a stab during movement. In particular, when the display panel has a flexible film as a base film, malfunction of the display panel may occur due to the appearance damage. However, according to the embodiments of the invention, the cushion layer is disposed under the compensation layer and is adhered to the compensation layer. Thus, the back surface of the display panel may be protected by the cushion layer before the display module is assembled with the set.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:
1. A display device comprising:
a display panel comprising a display area for displaying an image; and
a protective film adhered to a back surface of the display panel,
wherein the protective film comprises:
a compensation layer being in contact with the back surface of the display panel and comprising a first area and a second area;

a release layer disposed under the compensation layer; and a cushion layer disposed under the release layer, wherein the release layer and the cushion layer overlap with the first area and do not overlap with the second area in a plan view, and wherein the second area overlaps with the display area of the display panel.

2. The display device of claim 1, further comprising a bracket disposed under the protective film.

3. The display device of claim 2, wherein a concave region is provided in an area of the bracket which overlaps with the first area in a plan view.

4. The display device of claim 3, wherein at least a portion of the cushion layer is accommodated in the concave region.

5. The display device of claim 3, further comprising a back case disposed under the bracket, wherein a space is defined between the bracket and the back case.

6. The display device of claim 5, further comprising an electronic component disposed in the space.

7. The display device of claim 1, wherein an area of the compensation layer is greater than an area of each of the cushion layer and the release layer.

8. The display device of claim 1, wherein an adhesive strength of the release layer is greater than 4 gf/25 mm and less than 700 gf/25 mm.

9. The display device of claim 1, wherein the compensation layer is adhered to an entire portion of the back surface of the display panel.

10. The display device of claim 1, wherein a thickness of the cushion layer is greater than a thickness of the compensation layer.

11. The display device of claim 1, wherein the protective film further comprises an adhesive layer disposed between the release layer and the cushion layer.

12. A display device comprising:
a display panel for displaying an image;
a protective film adhered to a back surface of the display panel;
a bracket disposed under the protective film;
a case disposed under the bracket; and
an electronic component disposed between the bracket and the case,
wherein the protective film comprises:
a compensation layer being in contact with the back surface of the display panel and comprising a first area and a second area overlapping the electronic component;
a release layer disposed under the compensation layer; and
a cushion layer disposed under the release layer, and
wherein the release layer and the cushion layer overlap with the first area and do not overlap with the second area in a plan view.

13. The display device of claim 12, wherein the compensation layer is adhered to an entire portion of the back surface of the display panel.

14. The display device of claim 12, wherein an area of the compensation layer is greater than an area of each of the cushion layer and the release layer.

15. The display device of claim 12, wherein a space is defined between the bracket and the case overlapping the second area, and the electronic component is disposed in the space.

16. The display device of claim 12, wherein a thickness of the cushion layer is greater than a thickness of the compensation layer.

17. A display device comprising:
a display panel for displaying an image; and
a protective film adhered to a back surface of the display panel,
wherein the protective film comprises:
a compensation layer being in contact with the back surface of the display panel;
a release layer disposed under the compensation layer; and
a cushion layer disposed under the release layer, and
wherein the cushion layer and the release layer do not overlap a center of the display panel.

18. The display device of claim 17, wherein a thickness of the cushion layer is greater than a thickness of the compensation layer.

19. The display device of claim 17, further comprising:
a bracket disposed under the protective film;
a back case disposed under the bracket; and
an electronic component disposed between the bracket and the back case,
wherein a space is defined between the bracket and the back case not to overlap with the release layer and the cushion layer, and the electronic component is disposed in the space.

* * * * *